US006529386B2

United States Patent
Boe

(10) Patent No.: US 6,529,386 B2
(45) Date of Patent: *Mar. 4, 2003

(54) APPARATUS AND METHOD FOR RETAINING A CIRCUIT BOARD

(75) Inventor: Craig L. Boe, Nampa, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/021,555

(22) Filed: Dec. 12, 2001

(65) Prior Publication Data

US 2002/0109975 A1 Aug. 15, 2002

Related U.S. Application Data

(63) Continuation of application No. 09/330,374, filed on Jun. 10, 1999, now Pat. No. 6,370,036.

(51) Int. Cl.⁷ ................................................ H05K 7/12
(52) U.S. Cl. ...................... 361/801; 361/683; 361/785; 361/802; 361/807; 439/327; 24/563
(58) Field of Search ................................ 361/801, 802, 361/785, 807, 809, 810; 439/327, 357; 24/563

(56) References Cited

U.S. PATENT DOCUMENTS

| 3,567,998 A | 3/1971 | Ammerman |
| 3,775,643 A | 11/1973 | Schachnow et al. |
| 3,829,741 A | 8/1974 | Athey |
| 4,070,081 A | 1/1978 | Takahashi |
| 4,080,031 A | 3/1978 | Sawford-Atkins |
| 4,168,877 A | 9/1979 | Little et al. |
| 4,598,962 A | 7/1986 | Reitz et al. |
| D296,323 S | 6/1988 | McCarthy |
| 4,901,204 A | 2/1990 | Hayashi |
| 4,914,552 A | 4/1990 | Kecmer |
| 4,933,746 A | 6/1990 | King |
| 5,001,606 A | 3/1991 | Kreimer |
| 5,040,096 A | 8/1991 | Churchill et al. |
| 5,267,872 A | 12/1993 | Gou et al. |
| 5,280,409 A | 1/1994 | Selna et al. |
| 5,286,217 A | 2/1994 | Liu et al. |
| 5,290,174 A | 3/1994 | Woratyla et al. |
| 5,331,507 A | 7/1994 | Kyung et al. |
| 5,359,489 A | 10/1994 | Hass et al. |
| 5,372,518 A | 12/1994 | Liu et al. |

(List continued on next page.)

FOREIGN PATENT DOCUMENTS

| JP | 50173421 | 5/1994 |
| SU | 785-117 | 11/1972 |
| SU | 859-237 | 2/1976 |

OTHER PUBLICATIONS

U.S. patent application Ser. No. 08/974,542, "Component Mounting Module For Printed Circuit Assemblies" filed Feb. 22, 2000.

U.S. patent application Ser. No. 09/422,044, "Processor and Circuit Board Retaining Apparatus and Method" filed Oct. 20, 1999.

Primary Examiner—Jayprakash N. Gandhi
(74) Attorney, Agent, or Firm—Perkins Coie LLP

(57) ABSTRACT

The present invention provides for an apparatus and method for retaining a first circuit board on a second circuit board. Embodiments of the invention use a clip attached to uprights to exert a biasing force on the first circuit board. The uprights are also coupled to the second circuit board. In embodiments of the invention, the first circuit board is a processor package such as a processor package for use in a Slot 1 or Slot 2 connector, and the second circuit board is a motherboard of a computer system. Embodiments of the invention also include a memory module and a power supply.

27 Claims, 8 Drawing Sheets

U.S. PATENT DOCUMENTS

| | | |
|---|---|---|
| 5,396,402 A | 3/1995 | Perugini et al. |
| 5,417,580 A | 5/1995 | Tsai |
| 5,457,938 A | 10/1995 | Butterfield et al. |
| 5,515,664 A | 5/1996 | Tanaka et al. |
| 5,542,854 A | 8/1996 | Bowen |
| 5,642,263 A | 6/1997 | Lauruhn |
| 5,642,603 A | 7/1997 | Tanaka |
| 5,650,917 A | 7/1997 | Hsu |
| 5,668,348 A | 9/1997 | Lin |
| 5,701,231 A | 12/1997 | Do et al. |
| 5,726,865 A | 3/1998 | Webb et al. |
| 5,781,414 A | 7/1998 | Miller et al. |
| 5,822,197 A | 10/1998 | Thuault |
| 5,829,601 A | 11/1998 | Yurchenco et al. |
| 5,870,287 A | 2/1999 | Rodriguez et al. |
| 5,889,656 A | 3/1999 | Yin |
| 5,928,024 A | 7/1999 | Ming-Huang |
| 5,943,218 A | 8/1999 | Liu |
| 6,007,357 A | 12/1999 | Perino et al. |
| 6,031,715 A | 2/2000 | Magette |
| 6,056,579 A | 5/2000 | Richard, III et al. |

APPARATUS AND METHOD FOR RETAINING A CIRCUIT BOARD

CROSS-REFERENCE TO RELATED APPLICATION

This application is a continuation of U.S. patent application Ser. No. 09/330,374 filed Jun. 10, 1999, now U.S. Pat. No. 6,370,036.

TECHNICAL FIELD

The present invention is directed toward an apparatus and method for retaining a first circuit board on a second circuit board such as a motherboard.

BACKGROUND OF THE INVENTION

Computer systems often include a plurality of integrated circuit boards capable of performing different functions when interconnected to one another. Such an arrangement provides advantages of enhanced standardization of parts as well as increased varieties of possible computer systems. For instance, using the same basic hardware, many variations of a computer system may be created by including or not including various functionally distinct circuit boards with components based on the circuit boards. Additionally, circuit boards with computer components may be replaced with more capable circuit boards as such devices are developed.

A typical arrangement for a computer system is to have a backplane circuit board, such as a motherboard, that serves as a platform on which the computer system may be built. The motherboard typically has a number of sockets or slots into which other circuit boards with components may be plugged to form electrical and mechanical connections between the circuit boards and the motherboard. Examples of circuit boards with components that may be plugged into the motherboard include one or more central processing units, main memory cards, video adapter cards, video acceleration cards, sound cards, SCSI controller cards, parallel or serial interface cards, game adapter cards, network cards, and others. Circuit boards with components such as these may plug into a motherboard through connectors along one edge of the circuit board. The edge connectors plug directly into a slot or socket. When attached in this manner, the circuit board may be substantially perpendicular to the motherboard.

While it is convenient to have circuit boards with components that may be added to or removed from a motherboard so easily, significant problems are created if the circuit boards become electrically disconnected from the motherboard. Maintenance of a secure electrical connection can be assured by an adequate mechanical connection. Mechanical and subsequent electrical disconnection may occur when a computer system is subjected to jarring loads like those present during shipping. Therefore, significant design efforts have been directed toward adequate mechanical connection between socket connected circuit boards and the motherboard.

One connection that has been of particular concern is the connection between the central processing unit, or processor, and the motherboard. Such a processor is often resident on a circuit board. The circuit board and processor together will be referred to below as a processor package. The Intel Corporation P6-based processor packages connect to the motherboard through what is known as Slot 1 or Slot 2 connectors. A Slot 1, or 242-contact slot connector, is used with PENTIUM II, PENTIUM III, or CELERON processor packages and is shown in FIG. 1 as connector 104. The Slot 2, or 330-contact slot connector, is used with Xeon processor packages. However, Slot 1 and Slot 2 electrical connectors are not adequate to secure a processor package to a motherboard under normal service loads. Therefore, mechanical retaining structures must be added around a Slot 1 or Slot 2 connector to secure the processor package to the motherboard. A typical mechanical retaining structure is known as a "goal post" because it physically resembles a football goal post with two vertical uprights. See FIG. 1 illustrating goal post 100 and uprights 102. Each of the vertical uprights is positioned to support a vertical edge of a processor package that may be supported in connector 104. Support along the vertical edges, however, has not proven adequate to support the processor package. A PENTIUM II or PENTIUM III processor package is illustrated in FIG. 2 and a CELERON processor package is illustrated in FIG. 3.

To adequately support various Slot 1 and Slot 2 processor packages, a number of specialized retaining structures have been developed. For instance, U.S. Pat. Nos. 5,726,865 and 5,642,263 disclose such structures. A problem with both of these structures, however, is that they are not capable of functioning with each of the standard Slot 1 or Slot 2 processor packages. Additionally, the '865 patent requires special cutouts in the circuit board of the processor package. The '263 patent provides a top cover that gives additional retaining strength, but a single apparatus could not be used for processor packages of varying heights. Unfortunately, standard processor packages come in different heights. For instance, a standard CELERON processor package is significantly taller than a standard PENTIUM III processor package. See FIGS. 2 and 3. Therefore, separate retaining apparatuses would be required for each different processor package under the '263 patent.

Another shortcoming is that the structure of the '263 patent is not designed to exert a downward biasing force on the processor package. Although the '263 patent would prevent a processor package from moving beyond the cover, a more optimal solution would create a downward biasing force on the processor package. Such a downward force would reduce the movement of the processor package in the connector, and consequently, would reduce wear on the connections between the processor package and the connector that could otherwise occur.

Goal post connectors capable of excepting both a standard CELERON processor package and a standard PENTIUM III processor package are currently commercially available. One such connector is Part No. PT11008-5301 made by FOXCONN Electronics, whose parent company is Hon Hai Precision Ind. Co., LTD., Taipei, Taiwan, R.O.C. As illustrated in FIG. 1, the FOXCONN type connector 100 provides holes 101 and 103 in both uprights 102. Holes 101 and 103 are for aligning with tabs 201 of a typical PENTIUM II or PENTIUM III processor package 200 as shown in FIG. 2. Two pairs of holes 101 and 103 are provided so that the processor 200 may face in either direction relative to the connector 100 (FIG. 1). For the CELERON processor package 300 shown in FIG. 3, the tabs 301 fit beneath the wings 105 or the wings 107 of the upright 102 as shown in FIG. 1. Two pairs of wings 105 and 107 are provided so that the processor 300 may face in either direction relative to the connector 100. Although the FOXCONN connector provides support for more than one variety of processor and does not require custom alterations to a processor, it alone does not provide adequate support under many observed service conditions.

An improved system would combine the flexibility and interchangability of a standardized goal post connector with the security and strength of a customized connector and processor. Further, the improved system would apply a biasing force to a processor package, or other circuit board, to further secure the device to a connector and its associated second circuit board. Additionally, an improved device would allow for a part to be merely added to an existing goal post type connector or similar structure. An improved device would also be easy to install and remove, requiring no tools or special skills to accomplish either task.

SUMMARY OF THE INVENTION

An embodiment of the invention is a clip for securing a first circuit board to a second circuit board. The clip is coupled to a first upright and a second upright. The uprights are coupled to a second circuit board. Therefore, by connection of the clip to the uprights, the first circuit board is secured relative to the second circuit board. The clip includes a first end for coupling to the first upright and an interior member coupled to the first end. A portion of the interior member contacts the first circuit board and biases the first circuit board toward the second circuit board. The clip also includes a second end coupled to the interior member. The second end is for coupling to the second upright.

Another embodiment of the invention is a computer system with a first circuit board and a first upright and a second upright engaged with the first circuit board to support the first circuit board. The computer system also has a second circuit board coupled to the first circuit board. The second circuit board is coupled to the uprights as well. The computer system has a memory module coupled to the second circuit board and a power supply electrically connected to the second circuit board. The computer system also has a clip to secure the first circuit board relative to the second circuit board. The clip includes a first end coupled to the first upright and an interior member coupled to the first end wherein a portion of the interior member contacts the first circuit board and biases the first circuit board toward the second circuit board. A second end of the clip is coupled to the interior member and is coupled to the second upright.

Still another embodiment of the invention is a method of securing a first circuit board to a second circuit board. The method includes the acts of coupling the first circuit board to a slot connector on the second circuit board. By this connection, two opposite edges of the first circuit board are supported by two uprights at the two opposite edges. The two uprights are coupled to the second circuit board. Another act of the method is attaching a clip between the two uprights such that a portion of the clip contacts the first circuit board and biases the first circuit board toward the second circuit board.

DETAILED DESCRIPTION OF THE INVENTION

Figure 4:
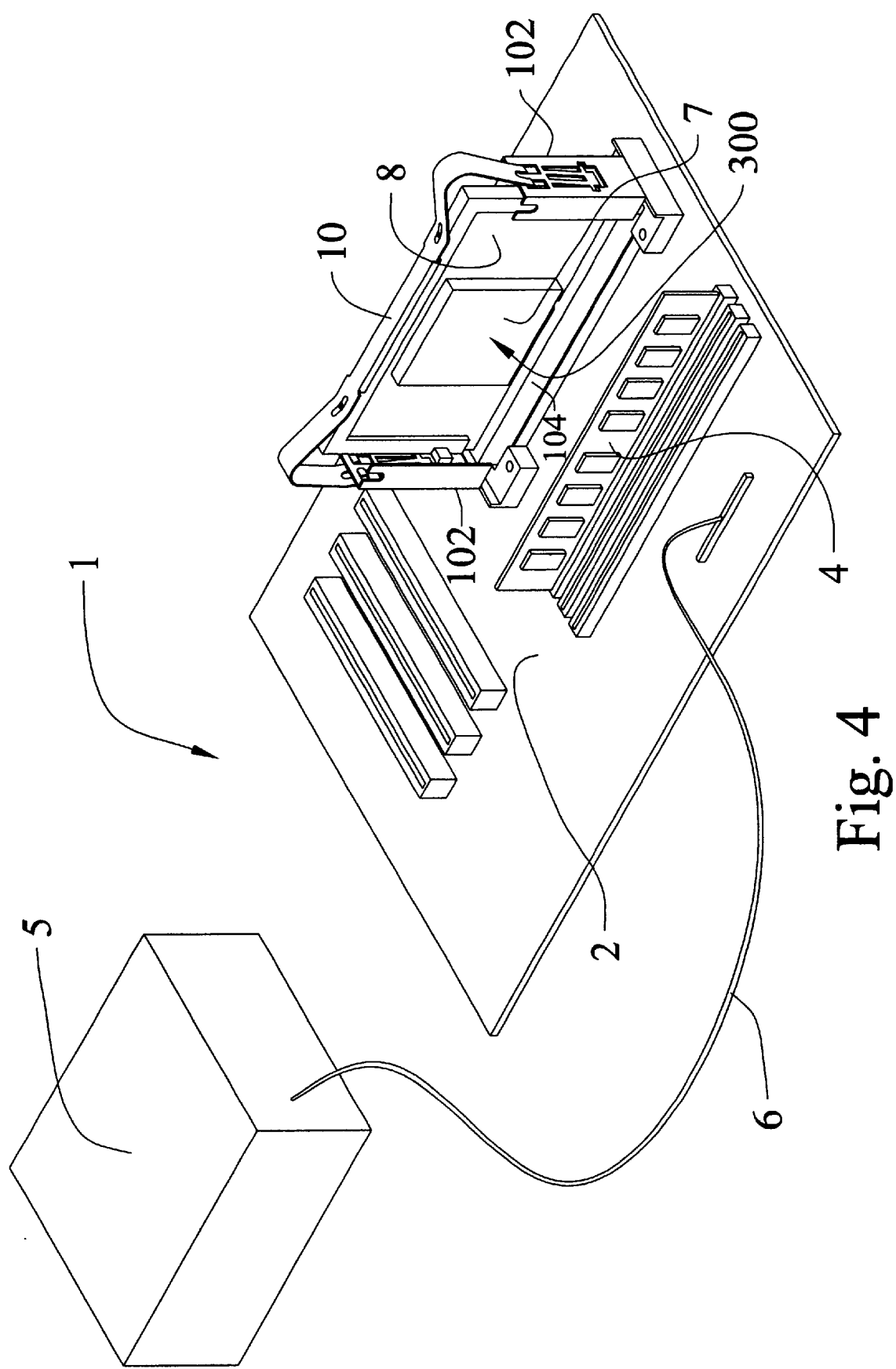
FIG. 4 is a perspective view of an embodiment of the invention.

Embodiments of the present invention are directed toward a computer system 1 as illustrated in FIG. 4. The computer system 1 includes a first circuit board. As shown, the first circuit board is a processor package 300. The computer system 1 also includes uprights 102 engaged with the first circuit board to support the first circuit board. The second circuit board 2 is coupled to the first circuit board. The second circuit board 2 is also coupled to the uprights 102. The system 1 includes a memory module 4 coupled to the second circuit board 2. A power supply 5 is also shown electrically connected to the second circuit board 2 via a power cable 6. The system 1 also has the clip 10 coupled to the uprights 102 to secure the first circuit board relative to the second circuit board 2.

First Circuit Board

Figure 1:
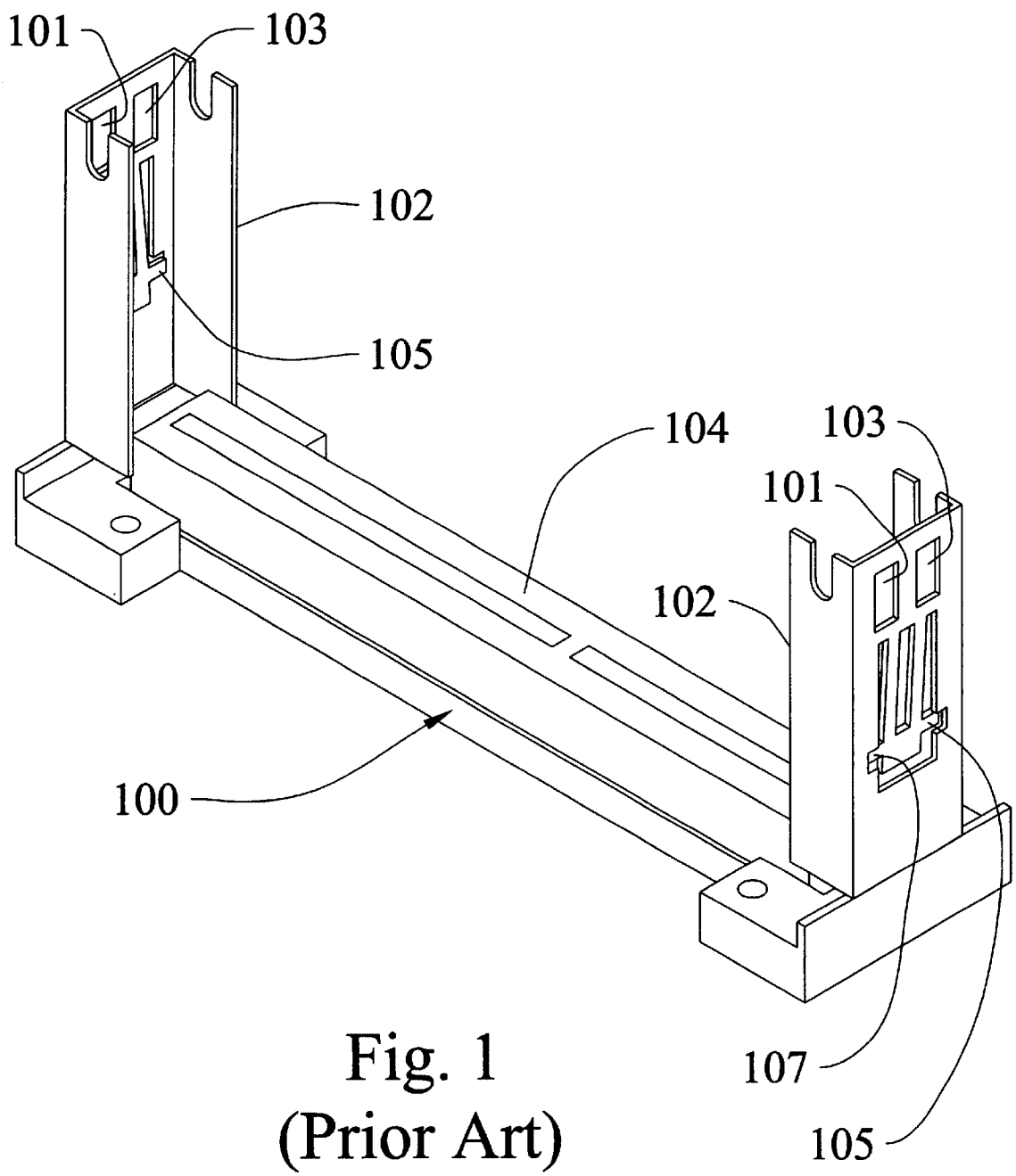
FIG. 1 is a perspective view of a slot connector and a goal post connector.
Figure 2:
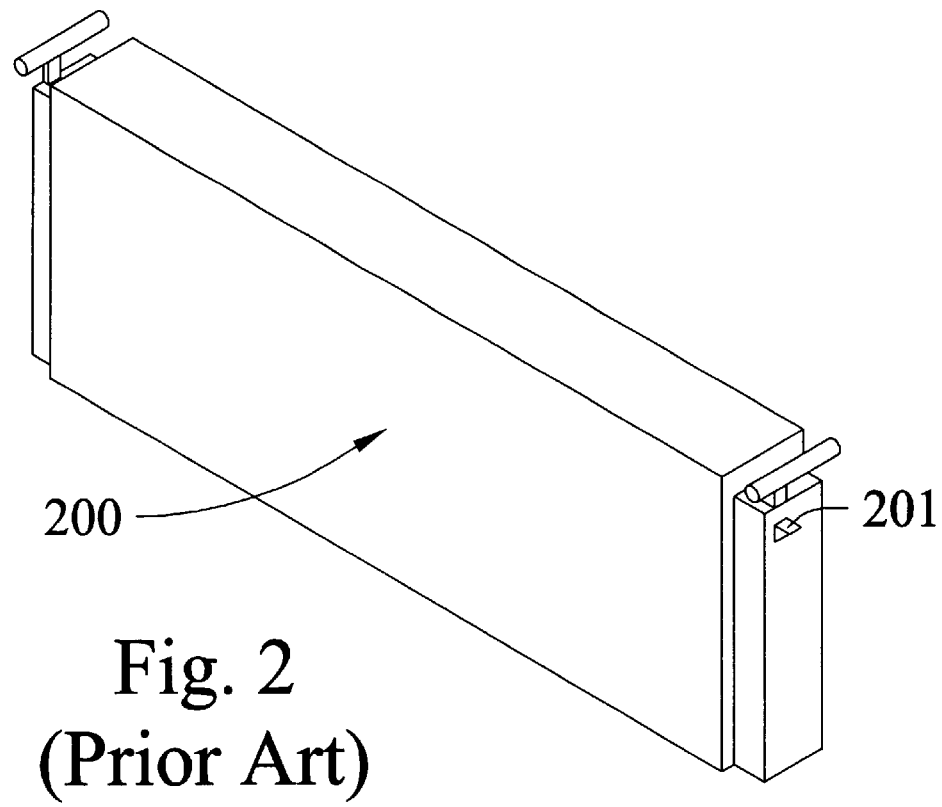
FIG. 2 is a perspective view of an Intel Corporation PENTIUM II or PENTIUM III processor package.
Figure 3:
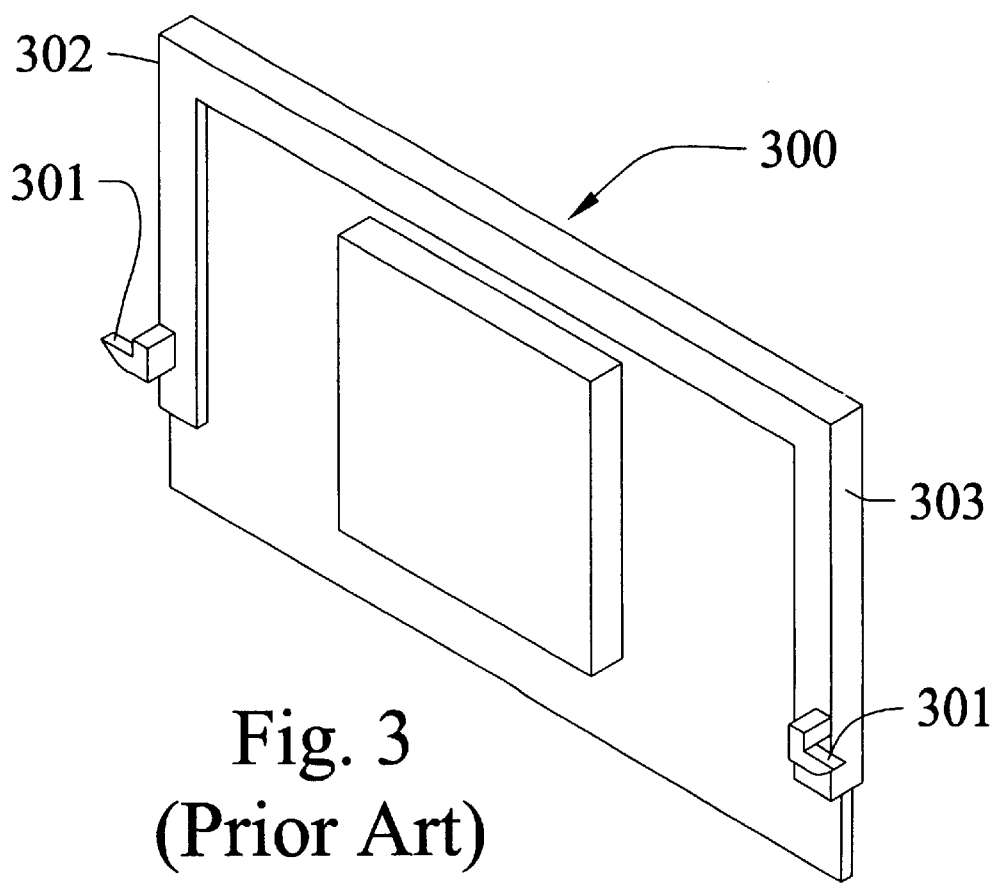
FIG. 3 is a perspective view of an Intel Corporation CELERON processor package.

As illustrated in FIG. 4, the first circuit board is an Intel Corporation CELERON processor package 300. An enlarged view of the CELERON processor package 300 is shown in FIG. 3. In other embodiments of the invention, the first circuit board could be another type of circuit board such as an Intel Corporation PENTIUM II or PENTIUM III processor package 200 as shown in FIG. 2, or other processor packages. As illustrated in FIG. 4, the processor package 300 may include a processor 7 mounted on a base circuit board 8. Other embodiments may include circuit boards such as main memory cards, video adapter cards, video acceleration cards, sound cards, SCSI controller cards, parallel or serial interface cards, game adapter cards, network cards, and others.

Uprights

The uprights 102 engage and support the first circuit board. The specific interactions between the uprights 102 and the PENTIUM processor package 200 (FIG. 2) and the CELERON processor package 300 (FIG. 3) are detailed in the Background section above. Specific shortcomings of these interactions are also noted. While a specific structure for the uprights is illustrated to provide an example, many other structures of uprights would provide similar engagement with the first circuit board.

Second Circuit Board

As illustrated in FIG. 4, the second circuit board 2 is coupled to the first circuit board. As shown, the second circuit board 2 is a motherboard coupled to the first circuit board, where the first circuit board is a processor package 300. The coupling may be through a socket connector 104. In FIG. 4, the socket connector 104 is soldered to the second circuit board 2 and accepts the first circuit board by insertion into the socket connector 104. The second circuit board 2 is also coupled to the uprights 102. The first circuit board may be coupled to the second circuit board 2 such that the primary plane of each circuit board is substantially perpendicular to the primary plane of the other. The substantially perpendicular relationship is illustrated in FIG. 4.

While the second circuit board 2 is a motherboard in the illustrated example of FIG. 4, the second circuit board may be a variety of other types of circuit boards. For instance, the second circuit board could itself be a circuit board extending from a motherboard. An example is a riser card of a NLX configuration computer. In that case, the riser card extends from the motherboard, but may still employ embodiments of the invention to retain another circuit board to the riser card. Such riser cards are known to those skilled in the art.

Memory Module

As shown in FIG. 4, the memory module 4 is coupled to the second circuit board 2. The memory module illustrated is a SDRAM main memory module. However, other memory modules are within the scope of the invention. For instance, memory modules used for various purposes including but not limited to memory modules of the following technologies may be functional in embodiments of the invention: DRAM, SLDRAM, DDR SDRAM, DRDRAM, RDRAM, SRAM, ROM, PROM, EPROM, and EEPROM.

Power Supply

A power supply 5 is electrically connected to the second circuit board 2 through a power cable 6 as illustrated in FIG. 4. In other embodiments, power could be supplied through traces in a circuit board connected to a power supply rather than through a power cable.

Clip

Figure 5:
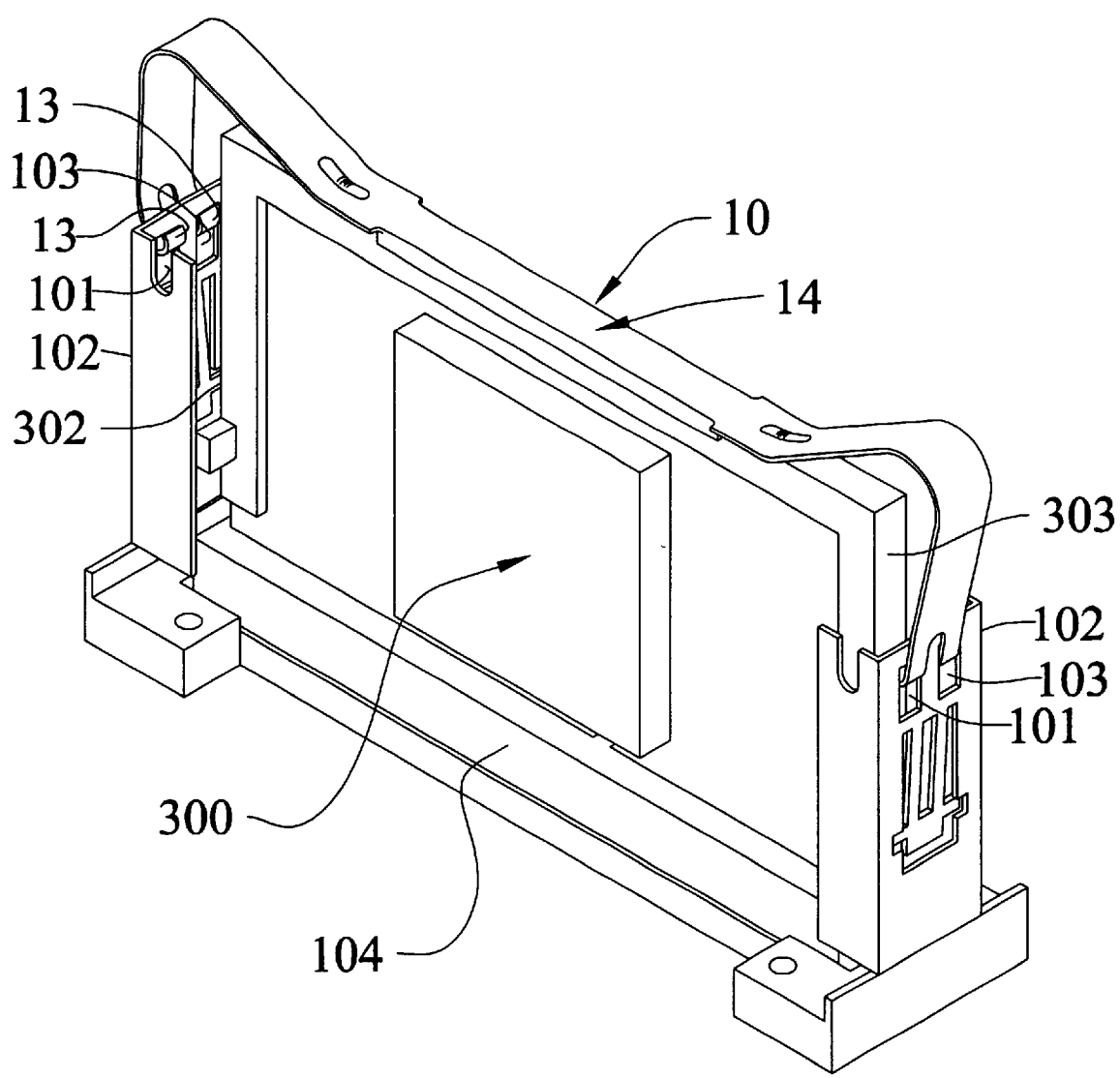
FIG. 5 is an enlarged perspective view of an embodiment of the invention.

An element of the computer system 1, as well as an embodiment of the invention, is a clip 10. As better illustrated in FIG. 5, the clip 10 secures the first circuit board relative to the second circuit board 2 (FIG. 4). The clip 10 is more specifically shown in FIGS. 6 and 7. The clip has a first end 11 for coupling to a first of the uprights 102. The first end 11 may include a section with an arcuate shape 12. The first end 11 may also include a pair of adjacent hooks 13 at its distal end for coupling with the first upright. As shown in FIG. 5, the adjacent hooks 13 may couple through the holes 101 and 103 of the upright 102. In other similar embodiments, a single hook 13, or some other equivalent means of coupling, may be provided. In some embodiments, the first end 11 may be made from spring steel. In other embodiments, the first end 11 may be made from other materials having sufficient strength and flexibility to secure a circuit board as described by this disclosure.

The clip 10 also includes an interior member 14. The interior member 14 is coupled to the first end 11. In some embodiments, the interior member 14 is made from spring steel, but other embodiments may be made from other suitable materials. As shown in FIG. 5, a portion of the interior member 14 contacts the first circuit board and biases the first circuit board toward the second circuit board. As illustrated, the biasing is in the downward direction. The biasing force is important because it not only prevents the first circuit board from moving upwardly beyond the clip 10, but it also prevents extraneous movement of the first circuit board that can cause wear on the contacts of the circuit board.

Figure 6:
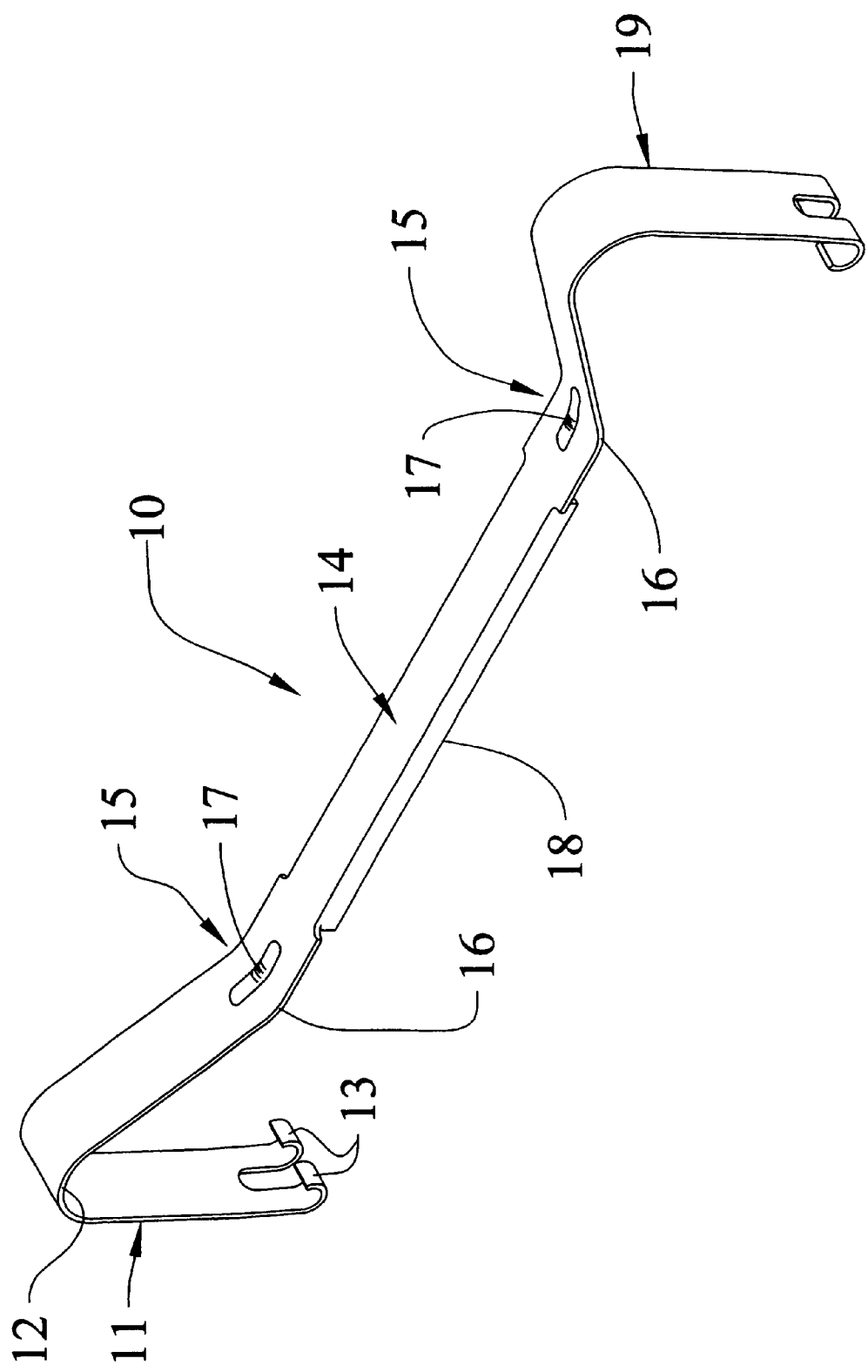
FIG. 6 is a perspective view of an embodiment of the invention as may be employed in the functional context of FIG. 5.
Figure 7:
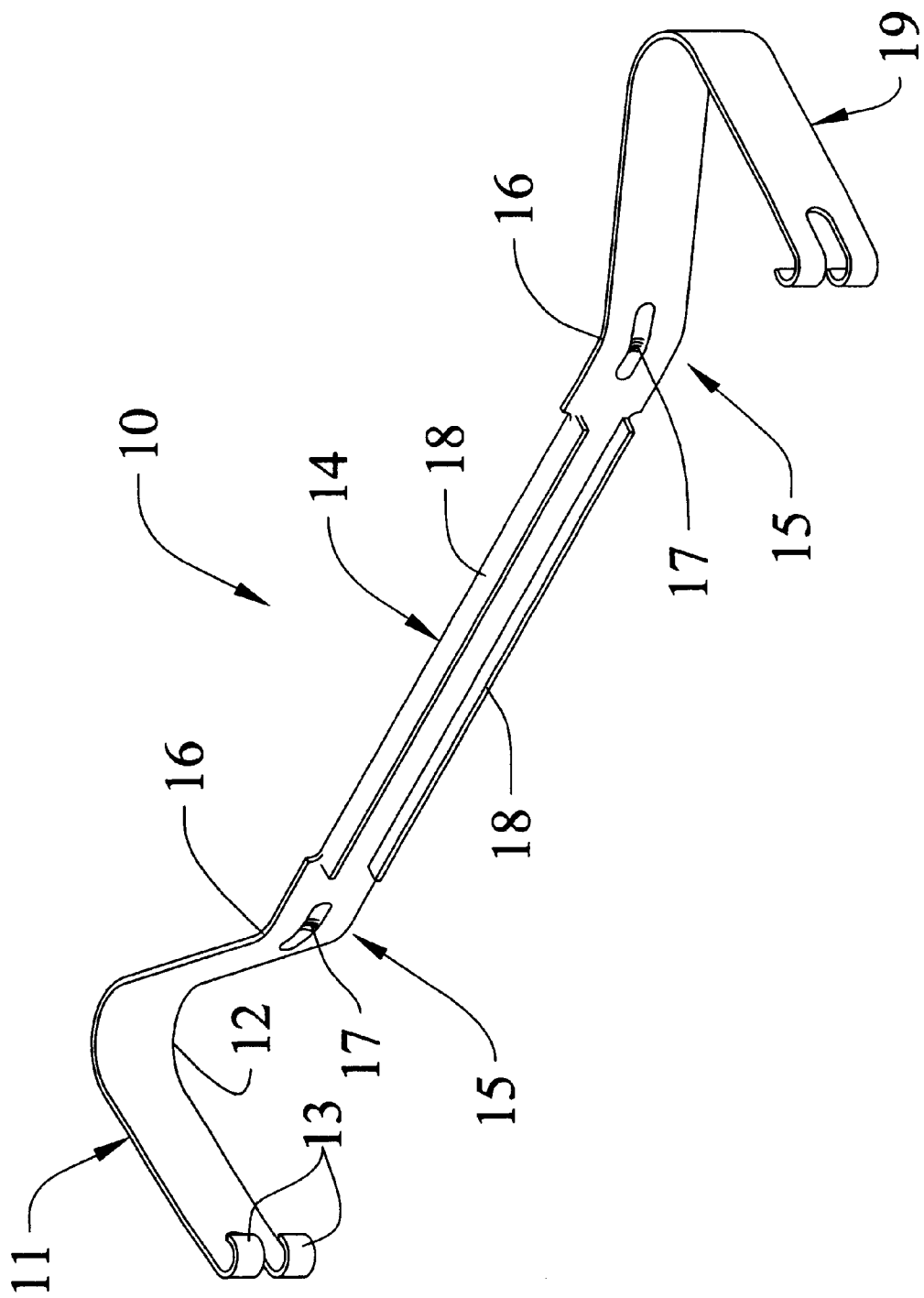
FIG. 7 is a perspective view of the embodiment of the invention of FIG. 6 rotated by 90°.

The interior member 14 may also include one or more stiffened regions 15 as shown in FIGS. 6 and 7. The stiffened region 15 provides resistance to bending moments that are induced in the interior member 14 in providing a biasing force on the first circuit board. The stiffened region 15 may have a first bend 16 substantially perpendicular to the longitudinal dimension of the interior member 14. Additionally, the stiffened region 15 may have a second bend 17 substantially perpendicular to the first bend 16 and intersecting the first bend. In embodiments of the invention, the stiffened region 15 may be the portion of the interior member 14 that contacts the first circuit board and biases the first circuit board toward the second circuit board.

As shown in FIGS. 6 and 7, the interior member 14 has two retaining members 18 attached along its longitudinal edges. As applied in FIG. 5, the clip 10 with retaining members 18 restricts movement of the first circuit board in a substantially perpendicular direction relative to the primary plane of the retaining member 18. In FIG. 5, the clip 10 with retaining members 18 is shown on top of a first circuit board. In this case, the first circuit board is an Intel Corporation CELERON processor package 300. The retaining members 18 project down the sides of the first circuit board and thereby restrict movement of the first circuit board.

The clip 10 has a second end 19 coupled to the interior member 14. The second end 19 is also coupled to the second upright. The configuration and functions of the second end 19 are substantially similar to the configuration and functions of the first end 11 in the embodiments illustrated. However, other embodiments may have alternate configurations and functions similar to the variations described in association with the first end 11 above.

Figure 8:
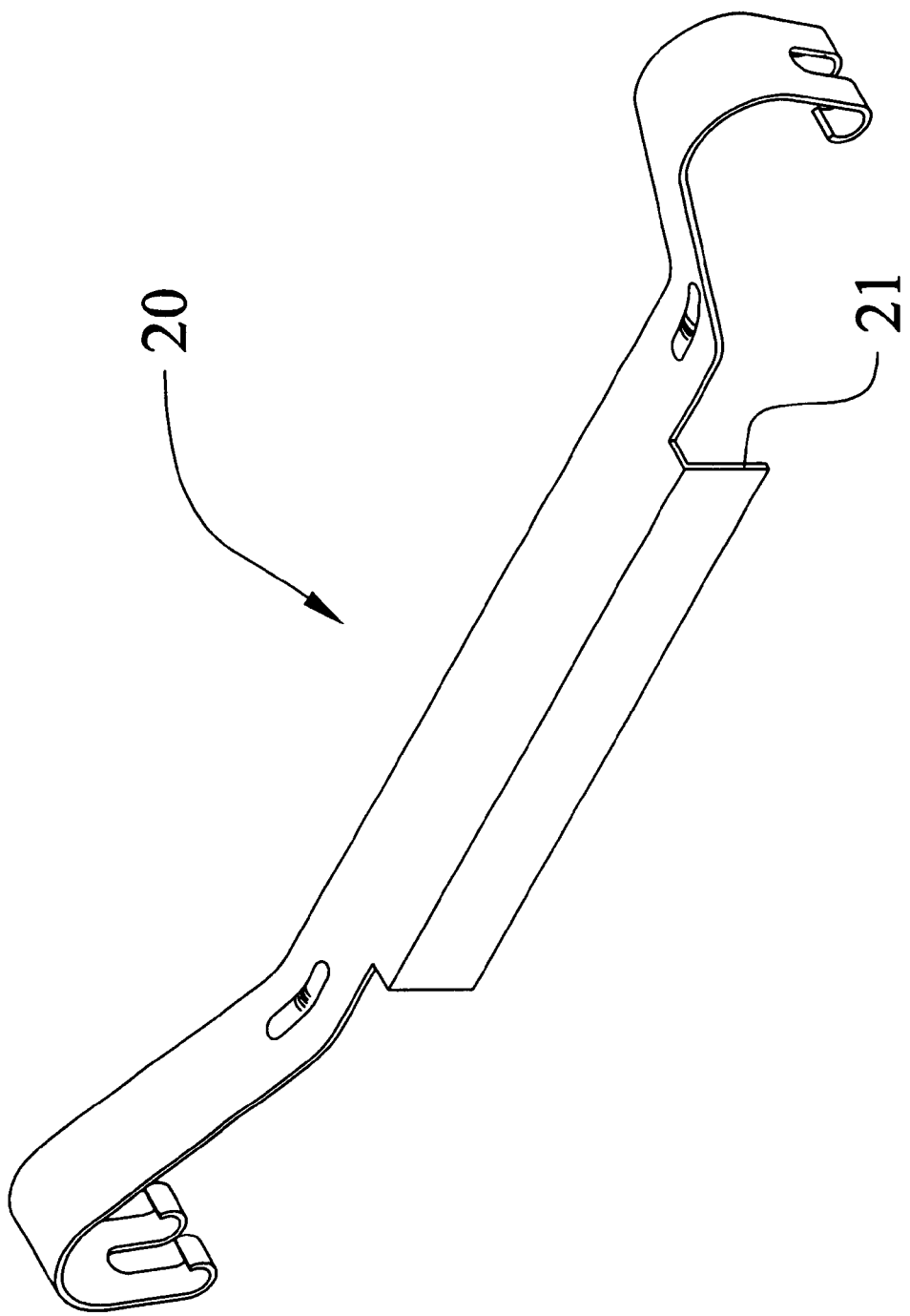
FIG. 8 is a perspective view of an embodiment of the invention.
Figure 9:
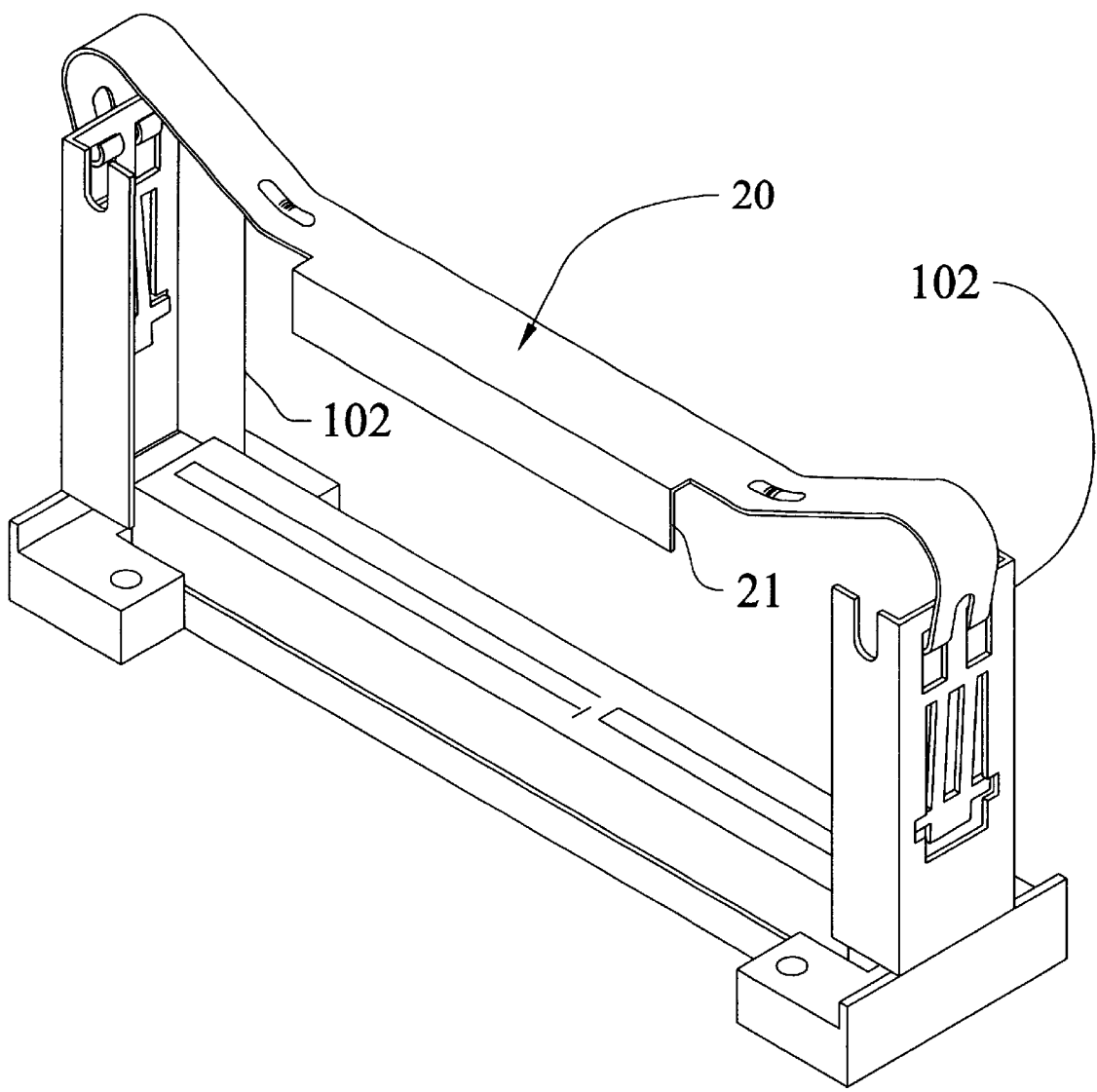
FIG. 9 is a perspective view of the embodiment of FIG. 8 illustrated in a functional context.

FIGS. 8 and 9 illustrate another embodiment of the clip. The clip 20 as shown is specially adapted to provide a biasing force to an Intel Corporation PENTIUM II or PENTIUM III processor package 200, like the one shown in FIG. 2. The clip 20 is substantially the same as the clip 10 described above except for its height and its retaining member 21. The retaining member 21 is configured to support the processor package along one of its sides rather than two. In FIG. 9, no processor package 200 is shown so that the coupling of the clip 20 and the uprights 102 may be more easily viewed.

In some embodiments, the first end 11, the interior member 14, and the second end 19 may be formed from a single piece of material. In some of those embodiments, the single piece of material is spring steel.

Method of Securing a First Circuit Board to a Second Circuit Board

An embodiment of the invention is a method of securing a first circuit board to a second circuit board. In operation, the first circuit board is coupled to a slot connector on the second circuit board. As illustrated in FIG. 4, the first circuit board is a processor package 300 that is inserted into the connector 104 on the second circuit board 2. In the orientation illustrated, the processor package 300 is aligned above the connector 104 and moved downwardly to couple with the connector. As shown in FIG. 5, two opposite edges, 302 and 303 of the first circuit board are supported by two uprights 102 at the two opposite edges. The two uprights 102 are coupled to the second circuit board 2 (FIG. 4). Another act of embodiments of the method is to attach a clip 10 between the two uprights 102 such that a portion of the clip contacts the first circuit board and biases the first circuit board toward the second circuit board 2. As shown in FIG. 5, the clip 10 is attached to the uprights 102 by hooks 13 that are a part of the clip 10.

From the foregoing it will be appreciated that, although specific embodiments of the invention have been described herein for purposes of illustration, various modification may be made without deviating from the spirit and scope of the invention. Accordingly, the invention is not limited except as by the claims.

ADVANTAGES OF THE INVENTION

Embodiments of the invention combine use of a standardized goal post connector with the enhanced connection strength of a biasing clip. Therefore, by adding a clip to an existing goal post, a processor package, or other circuit board, is connected to a second circuit board in an improved manner. Embodiments of the clip are such that no tools or excessive forces are required to install or remove the clip. The fact that the clip actively biases a circuit board toward a second circuit board enhances the effectiveness of the connection created.

What is claimed is:

1. A computer system comprising:
   a primary circuit board;
   a first upright and a second upright, the first and second uprights being connected to the primary circuit board;
   a secondary circuit board coupled to the primary circuit board, wherein the secondary circuit board engages a portion of the first upright and a portion of the second upright;
   a memory module coupled to the primary circuit board;
   a power supply electrically connected to the primary circuit board; and
   a clip comprising
      a first end coupled to the first upright;
      a second end coupled to the second upright; and
      an interior member extending between the first end and the second end, the interior member being configured to contact a portion of the secondary circuit board and press the secondary circuit board toward the primary circuit board.

2. The computer system of claim 1 wherein the secondary circuit board is a processor package.

3. The computer system of claim 1 wherein the primary circuit board is a motherboard.

4. The computer system of claim 1 wherein the primary circuit board further includes a socket connector and a portion of the secondary circuit board is received in the socket connector.

5. The computer system of claim 1 wherein the secondary circuit board is coupled to the primary circuit board such that a primary plane of the primary circuit board is at least substantially perpendicular to a primary plane of the secondary circuit board.

6. The computer system of claim 1 wherein the first end includes an arcuate shape.

7. The computer system of claim 1 wherein the first end includes a hook for coupling with the first upright.

8. The computer system of claim 1 wherein the first end includes a pair of adjacent hooks for releasably coupling the first end to the first upright.

9. The computer system of claim 1 wherein the first end is made from spring steel.

10. The computer system of claim 1 wherein the interior member includes a stiffened region for resisting bending deformation of the stiffened region.

11. The computer system of claim 10 wherein the stiffened region includes:
    a first bend substantially perpendicular to a longitudinal dimension of the interior member, and
    a second bend substantially perpendicular to the first bend and intersecting the first bend.

12. The computer system of claim 10 wherein the stiffened region contacts the secondary circuit board and biases the secondary circuit board toward the primary circuit board.

13. The computer system of claim 1 wherein the interior member further comprises a retaining member attached along a longitudinal edge of the interior member for restricting movement of the secondary circuit board substantially perpendicular to a primary plane of the retaining member.

14. The computer system of claim 1 wherein the interior member is made from spring steel.

15. The computer system of claim 1 wherein the second end includes an arcuate shape.

16. The computer system of claim 1 wherein the second end includes a hook for coupling with the second upright.

17. The computer system of claim 1 wherein the second end includes a pair of adjacent hooks for coupling with the second upright.

18. The computer system of claim 1 wherein the second end is made from spring steel.

19. The computer system of claim 1 wherein the first end, the interior member, and the second end are formed from a single piece of material.

20. The computer system of claim 19 wherein the single piece of material is spring steel.

21. A computer system comprising:
    a base circuit board having a slot connector;
    a first upright attached to the base circuit board proximate to one end of the slot connector;
    a second upright attached to the base circuit board proximate to another end of the slot connector;
    a secondary circuit board having a connector edge received in the slot connector, a first side edge contacting the first upright, a second side edge contacting the second upright, and third edge between the first side edge and the second side edge; and
    a clip having a first end connected to the first upright, a second end connected to the second upright, and an interconnecting member extending between the first and second ends, the interconnecting member comprising a contact zone in contact with the third edge of the secondary circuit board to press the contact edge of the secondary circuit board into the slot connector.

22. The system of claim 21 wherein the base circuit board comprises a motherboard and the secondary circuit board comprises a processor.

23. The system of claim 21 wherein the first end of the clip comprises a first arcuate section, the second end of the clip comprises a second arcuate section, and the interconnecting member comprises a spring section having a medial longitudinal portion in contact with a substantial length of the third edge of the secondary circuit board.

24. A computer system comprising:
    a motherboard having a slot connector;
    a first upright attached to the motherboard proximate to one end of the slot connector;
    a second upright attached to the motherboard proximate to another end of the slot connector;
    a processor unit having a connector edge received in the slot connector, a first side edge contacting the first upright, a second side edge contacting the second upright, and third edge between the first side edge and the second side edge; and
    a clip having a first end connected to the first upright, a second end connected to the second upright, and an interconnecting member extending between the first and second ends, the interconnecting member being configured to press the contact edge of the processor unit into the slot connector.

25. A computer system comprising:
    a first circuit board;
    a second circuit board;
    a first upright attached to a first area of the second circuit board to secure a first portion of the first circuit board;
    a second upright attached to a second area of the second circuit board to secure a second portion of the first circuit board; and a clip having a first end connected to the first upright, a second end connected to the second upright, and an interconnecting member extending longitudinally between the first and second ends, the interconnecting member having a medial longitudinal contact zone in contact with a third portion of the second circuit board to drive the first circuit board toward the second circuit board.

26. The system of claim 25 wherein the first circuit board comprises a processor package and the second circuit board comprises a motherboard.

27. The system of claim 25 wherein the first circuit board is at least substantially perpendicular to the second circuit board.

* * * * *

UNITED STATES PATENT AND TRADEMARK OFFICE
CERTIFICATE OF CORRECTION

PATENT NO.    : 6,529,386 B2
DATED         : March 4, 2003
INVENTOR(S)   : Boe

It is certified that error appears in the above-identified patent and that said Letters Patent is hereby corrected as shown below:

<u>Column 3,</u>
Line 2, "interchangability" should be -- interchangeability --;

Signed and Sealed this

Eighth Day of July, 2003

JAMES E. ROGAN
*Director of the United States Patent and Trademark Office*